United States Patent
Wilkins et al.

(10) Patent No.: US 7,642,644 B2
(45) Date of Patent: Jan. 5, 2010

(54) PACKAGING FOR HIGH POWER INTEGRATED CIRCUITS

(75) Inventors: Wendy L. Wilkins, Rochester, MN (US); Barry K. Gilbert, Rochester, MN (US); Bruce R. Kline, Winona, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 11/720,383

(22) PCT Filed: Nov. 30, 2005

(86) PCT No.: PCT/US2005/043139

§ 371 (c)(1),
(2), (4) Date: May 29, 2007

(87) PCT Pub. No.: WO2006/060396

PCT Pub. Date: Jun. 8, 2006

(65) Prior Publication Data

US 2008/0093732 A1  Apr. 24, 2008

Related U.S. Application Data

(60) Provisional application No. 60/655,558, filed on Feb. 2, 2005, provisional application No. 60/632,917, filed on Dec. 3, 2004.

(51) Int. Cl.
*H01L 23/46* (2006.01)
*H01L 21/44* (2006.01)

(52) U.S. Cl. .............................. 257/721; 257/E23.097; 257/E23.088; 257/717; 257/715; 257/713; 257/712; 257/737; 257/738; 257/778; 257/784; 257/773; 257/774; 257/704; 257/706; 257/707; 257/711

(58) Field of Classification Search ................ 257/721, 257/E23.097, E23.088, 717, 713, 712, 727, 257/778, 784, 786, 714, 704, 706, 707, 711, 257/773, 774
See application file for complete search history.

(56) References Cited

U.S. PATENT DOCUMENTS

| | | | | | |
|---|---|---|---|---|---|
| 3,303,067 | A | * | 2/1967 | Haering et al. | 438/161 |
| 3,993,123 | A | * | 11/1976 | Chu et al. | 165/80.3 |
| 4,649,990 | A | * | 3/1987 | Kurihara et al. | 165/80.4 |
| 5,198,889 | A | * | 3/1993 | Hisano et al. | 257/678 |
| 5,625,227 | A | * | 4/1997 | Estes et al. | 257/712 |
| 5,931,222 | A | * | 8/1999 | Toy et al. | 165/80.3 |
| 5,946,544 | A | * | 8/1999 | Estes et al. | 438/15 |
| 6,709,890 | B2 | | 3/2004 | Ida et al. | |
| 2002/0159233 | A1 | * | 10/2002 | Patel et al. | 361/702 |
| 2004/0141296 | A1 | * | 7/2004 | Coico et al. | 361/752 |

(Continued)

OTHER PUBLICATIONS

International Search Report and Written Opinion Under Date of Mailing of Aug. 8, 2006, in connection with International Patent Application No. PCT/US2005/043139.

*Primary Examiner*—Alexander O Williams
(74) *Attorney, Agent, or Firm*—Quarles & Brady LLP

(57) ABSTRACT

A package for a semiconductor chip or other heat producing device has a supporting substrate to which the devices mount and electrically connect. An enclosure is formed over the heat producing devices and filled with a supercritical fluid that transports heat from the devices to a heat sink in thermal contact with the enclosure.

11 Claims, 3 Drawing Sheets

U.S. PATENT DOCUMENTS

| | | | |
|---|---|---|---|
| 2005/0068739 A1* | 3/2005 | Arvelo et al. | 361/718 |
| 2005/0168947 A1* | 8/2005 | Mok et al. | 361/698 |
| 2005/0249639 A1* | 11/2005 | Sugioka | 422/100 |
| 2008/0063493 A1* | 3/2008 | Cho et al. | 414/217 |
| 2008/0142048 A1* | 6/2008 | Parks | 134/21 |
| 2008/0223415 A1* | 9/2008 | Parks | 134/34 |

* cited by examiner

US 7,642,644 B2

PACKAGING FOR HIGH POWER INTEGRATED CIRCUITS

CROSS-REFERENCE TO RELATED APPLICATIONS

This application is based on U.S. Provisional Patent Application Ser. No. 60/655,558, filed on Feb. 2, 2005, and entitled "COOLING MECHANISM FOR SELF-CONTAINED INTEGRATED CIRCUIT USING A REVERSIBLE ENDOTHERMIC CHEMICAL REACTION" and U.S. Provisional Patent Application Ser. No. 60/632,917, filed Dec. 3, 2004 and entitled "PACKAGING FOR HIGH POWER INTEGRATED CIRCUITS USING SUPERCRITICAL FLUID."

BACKGROUND OF THE INVENTION

The field of the invention is the packaging of electronic devices such as semiconductors, and particularly, the cooling of such devices.

Modern digital and analog integrated circuits ("chips") are consuming ever-larger amounts of DC power as the number of transistors per unit area is increased in digital chips, and as the amount of output power required of analog chips (such as power amplifiers) is increased through the use of improved design techniques, more capable transistors, and new transistor materials (in the latter case: silicon germanium bipolar transistors; indium phosphide, gallium nitride, and silicon carbide transistors). The chips convert all or much of the DC power that they absorb from the power supply into heat: in the case of digital circuits, almost all of the DC input power becomes waste heat: and in the case of analog (i.e., amplifier) chips, 50-80% of the DC input power becomes waste heat. This waste heat must be removed to assure that the chip (or multiple chips in a subsystem) do not self-destruct. Silicon and indium phosphide chips can operate at temperatures up to approximately 85° C. Gallium nitride and silicon carbide chips can survive to much higher temperatures but still have a maximum operating temperature. The problem is that with ever-tighter packing of transistors on all of these chips, the power densities (heat loads) of these chips, measured in watts of power per square centimeter of chip area, are increasing very dramatically. Several years ago, a chip with thermal densities above 10 $W/cm^2$ was the norm; presently, even silicon chips have been designed with power densities of 350 $W/cm^2$. Prototype versions of gallium nitride and silicon carbide chips have been demonstrated "in the laboratory" operating at power densities in the range of 1500-3500 $W/cm^2$ and III-V compound semiconductor chips operate in the range of 450 $W/cm^2$. If these heat loads are not removed and the chips held to below their maximum operating temperatures, they will not only cease to function but may even completely self-destruct.

Many mechanisms have been used to cool "hot" chips. The two most common are conduction cooling and convection cooling, and the two are often combined. In the former, a chip is bonded (soldered or epoxy-attached) into a package which contains a large metal mass, such that the heat flows from the back of the chip directly into the metal mass, and then into a finned radiator, over which cool air is blown to remove the heat. In come cases, the lower temperature "sink" is a cold plate through which cold water, Freon, or other working fluid are passed as a transport fluid. In fact, for each level of chip power density, there are a range of cooling options that best match the overall system design considerations. The chart in FIG. 1 illustrates this point. As the overall power density of the chip increases, the cooling options decrease, and at power densities above 100-200 $W/cm^2$, the options become quite limited. Chip cooling by directly pumping a working fluid such as fluorocarbon onto the chip(s) has been developed and cutting microchannels in the back of the chips and pumping liquid through the microchannels has been developed in an effort to operate at these power densities.

SUMMARY OF THE INVENTION

This invention is a completely self-contained and encapsulated "package" into which a high power device such as an integrated circuit ("chip"), can be installed to provide the necessary thermal and electrical environment to assure that the high power device works correctly. The packaging approach not only assures that DC electrical power will be delivered to the device and signals will be brought into and led from the device in a correct manner, but also that the operating temperature of the device will remain below its maximum survivable operating temperature. The cooling approach uses a non-electrically conductive working fluid to create an isothermal environment for the device inside the package and to transfer heat to a "cold plate" or "cold pipe". The working fluid is a supercritical fluid or mixture of supercritical fluids that is operated above its critical temperature and pressure, where its viscosity and surface tension are extremely low and its ability to carry heat away from the hot device is very high.

An advantage of this invention is that it allows for direct device-side cooling of the device. The device is mounted to a substrate and an enclosed space is formed around the device which contains the working supercritical fluid. The much larger enclosure is cooled by more conventional means. The result is that cooling can take place through both sides of the device, rather than just the backside. This technique can be utilized with devices that are flip-chip attached or wirebonded to the substrate. Passivation of the device is not required with selection of the proper working fluid. Direct cooling is done in phase change cooling techniques such as thermosyphons and microchannel flows. The use of a supercritical fluid eliminates the problems of vapor entrapment and thermal shock due to the incipience temperature drop that are seen with phase change cooling.

This invention does not adversely affect the electrical performance of the device. A thermally conductive but electrically insulating supercritical fluid surrounds the interconnection between the device and the substrate. As an example, the dielectric constant of supercritical sulfur hexafluoride is close to that of air.

This invention also offers some mechanical advantages over other thermal management methods. The number of thermal interfaces needed is reduced because the working fluid is in direct contact with the heat generating device. One of the issues with attachment of heat spreaders and heat sinks is the need to compensate for the coefficient of thermal expansion (CTE) mismatch between the chip, heat spreader, and the heat sink. Commonly, thermally conductive adhesive must be used to transition between the heat spreader, which typically has a coefficient of thermal expansion ("CTE") matched to the power device, and the heat sink, which is typically a high CTE material. This interface increases the thermal resistance of the conduction path which in turn increases the junction temperature. The invention offers advantages for high shock and vibration environments, because the thermal path presented by the supercritical working fluid is not structural.

This invention may easily be used in combination with other thermal management techniques. For wirebonded chips, for example, heat spreaders and heat sinks can be attached to the back of the chip or package while the heat is also removed from the top by the supercritical fluid. Chip level cooling techniques such as thermal vias, thinned chips, on-chip integration of Peltier devices, microchannels in the back of the chip may also be used in conjunction with the supercritical fluid.

DETAILED DESCRIPTION OF THE PREFERRED EMBODIMENT

This invention is a completely self-contained and encapsulated "package" into which a high power integrated circuit ("chip") such as an amplifier, or an entire subsystem (such as a radar "transmit-receive" module), can be installed to provide the necessary thermal and electrical environment to assure that the chip or multi-chip subsystem works correctly. The packaging approach not only assures that DC electrical power will be delivered to the chip(s) and AC signals will be brought into and led from the chip(s) in a correct manner, but also that the operating temperature of the chip(s) will remain below their maximum survivable operating temperature. This is accomplished by filling the package with a non-electrically conductive working fluid (or mixture) that is above its critical point. The primary package containing the chip(s) and a working fluid are completely hermetically sealed, and in the preferred embodiment the entire cooling process is a transfer of heat from the source of the heat (the chips) to the surface of a heat exchanger, with the heat transferred by the supercritical working fluid. An entire multi-chip system, such as a phased-array radar receiver transmit/receive module, with all of its chips and support components, can be packaged in the same manner as the "single chip" described below.

Figure 1:
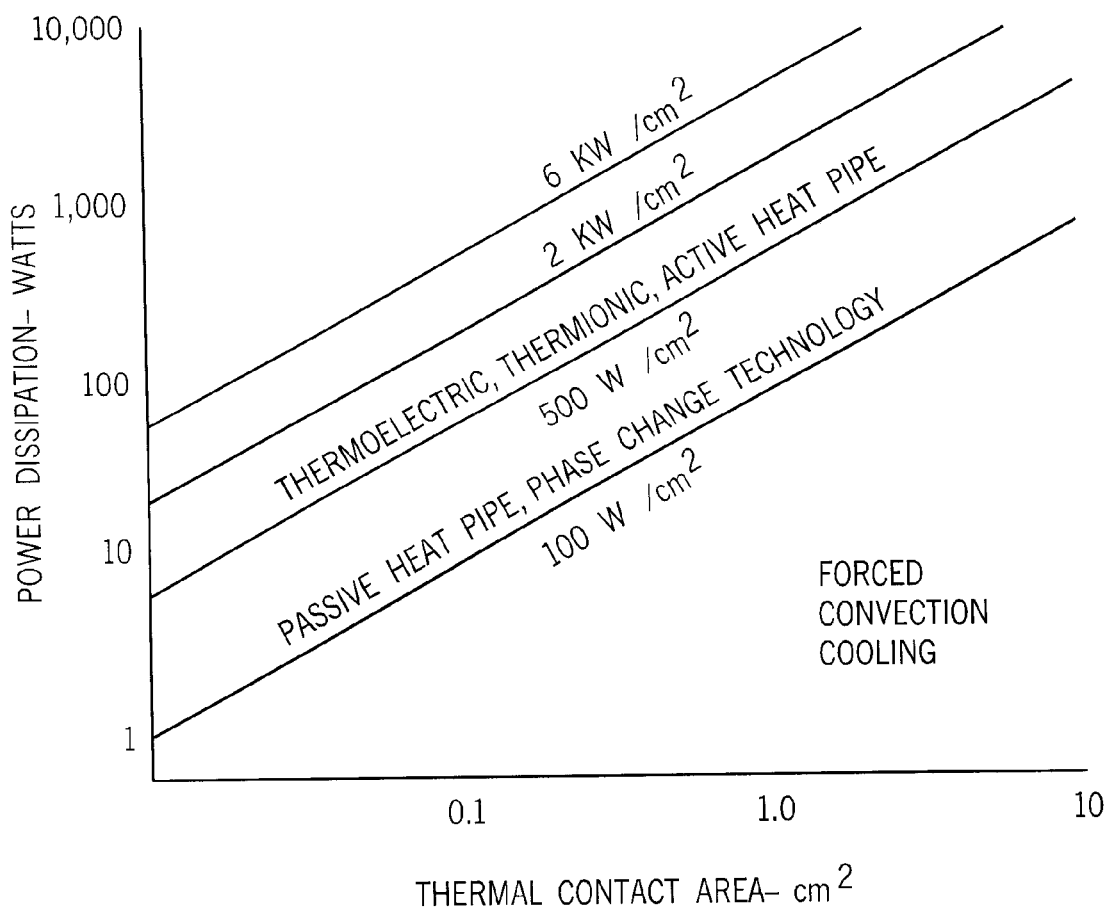
FIG. 1 is a graphic indication of the ranges of different cooling techniques.
Figure 2:
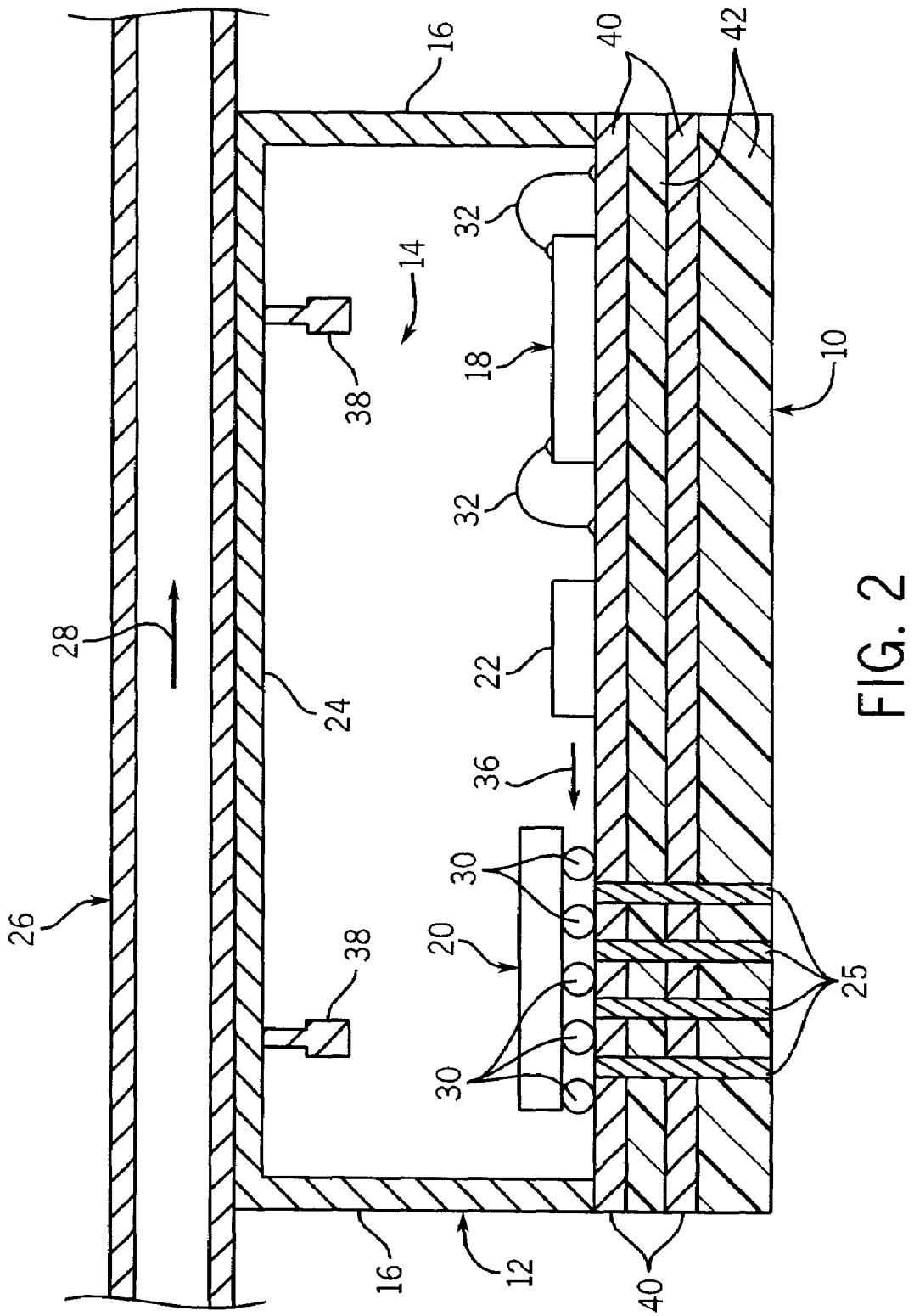
FIG. 2 is a pictorial representation of a preferred embodiment of the invention.

Referring particularly to FIG. 2, a preferred embodiment of the invention includes a substrate 10 which supports on its top surface one or more devices. As will be explained in more detail below, three devices 18, 20 and 22 are shown in this embodiment, but the invention is not limited to the particular devices used. An enclosure 12 made of a heat conductive material such as aluminum is attached to the substrate 10 and it extends over the devices 18, 20 and 22 to form an enclosed space indicated generally at 14. The enclosure 12 has side walls 16 that extend away from the top surface of the substrate 10 and surround the supported devices 18, 20 and 22 and a top wall 24 that covers the enclosed space 14. A heat exchanger in the form of a pipe 26 is in thermal contact with the top wall 24 and a cooling fluid indicated by arrow 28 is pumped through the pipe 26 to maintain the temperature of the top wall 24 at a desired level.

During operation, one or more of the devices 18, 20 and 22 produce significant amounts of heat which must be removed if the temperature is to be maintained below destructive levels. This is accomplished by a supercritical working fluid that fills the enclosed space 14. The nature of this working fluid is an important feature of the invention. The use of working fluids in other proposed approaches to the cooling of high power chips typically relies on the conversion of a liquid to a vapor, and the large latent heat of vaporization associated with the phase change. This invention does not rely on the change of phase of the working fluid, but instead on the fact that certain fluids, such as sulfur hexafluoride, can be driven into their "supercritical" range, where they have the following useful properties: 1) extremely low viscosity; 2) high thermal conductivity; 3) high heat capacity; 4) low surface tension; and 5) low dielectric constant.

The advantage of using supercritical fluids to transport heat away from devices 18, 20 and 22 lies in their unique physical properties compared to their liquid or gaseous phases. One example of the difference in properties that is exploited for heat transport away from very hot devices is that a typical fluid in its supercritical region has a density 100 times that of it gaseous phase and of the same order of magnitude as its liquid phase. In addition, it has a viscosity ten times greater than its gaseous phase but one-tenth to one-twentieth that of its liquid phase and a high degree of "wettability" due to an extremely low surface tension and energy. Thus, the supercritical fluid's transport properties are similar to that of a gas but the density approaches that of a liquid. The thermodynamic characteristics of a supercritical fluid can potentially be exploited as well. A study has shown that heat transfer coefficients for natural convection from a heated, vertical flat plate into a supercritical fluid are higher, and correctly selected fluids operating in their supercritical range can exhibit dielectric constants close to that of air, an important feature discussed in more detail below. The use of a chemically inert supercritical fluid allows a large degree of flexibility in the way that integrated circuits are installed into the package as will be discussed below.

The rightmost device 18 in FIG. 2 is an unpassivated wire-bonded chip mounted with its active or "top" surface face-up. Electrical connections are made with "wire bonds" from the chip pads to contact pads on the supporting substrate 10. Power and signal feeds to the contact pads on the chip can be by means of wire or ribbon bond 32, or a so-called chips first MCM overlay on the active chip surface. A unique feature of using a chemically inert supercritical working fluid as the heat transport mechanism is that unpassivated chips such as the III-V compound semiconductors such as gallium arsenide and indium phosphide can be exposed to the working fluid directly without concern for corrosion caused by the fluid. Further, since the dielectric constant of such a working fluid can approach that of air (i.e., 1.0), the electrical performance of microwave and millimeter wave analog chips will not be compromised by the presence of the working fluid above the active surface of the analog chip.

The leftmost device 20 is mounted to the substrate 10 such that its active surface is face-down, with electrical connections (signals, power, and ground) made between the contact pads on that chip and contact pads on the substrate 10 using solder balls or bumps, or gold balls 30. Unlike most chips attached in this manner (referred to as a "flip-chip" attachment), no epoxy or other type of "underfill" is inserted between the chip 20 and the substrate 10. The space between the solder bumps or gold balls 30 is thus accessible to the working fluid and it becomes an integral part of the cooling approach for this system. Very tiny externally powered micropumps, of either conventional or unconventional design, may be incorporated inside the enclosed space 14 to move the supercritical fluid. Microfluidic pumps of unconventional design such as a solid-state Micro-Electro-Mechanical System (MEMS) pump indicated at 22 may be employed to move fluid beneath the chip 20 as indicated by arrow 36. The purpose of the pump 22 is to transport a small quantity of fluid into the interstices between the gold or solder ball bonds 30 on one or two sides of chips mounted "face down", thus allowing heat to be carried away from the active surface of the chip and into the volume above all the chips. In the usual implementation of flip chip attachment, only the solder or gold ball bonds 30 conduct heat, because the interstices are usually filled with low-thermal-conductivity solid epoxy material. The combination of thermal conduction through the solder or gold balls 30 and movement of the working fluid between the active face of the chip 20 and the substrate 10, the amount of heat transferred from the active surface of the chip will be substantially increased.

The system will function properly in essentially any position with respect to gravity. The embodiment shown in FIG. 2 depicts a completely closed and hermetic cooling implementation in which the flow of supercritical fluid is driven by the source of and sink for the heat (the chips and the heat exchanger respectively). Baffles 38 attached to the top 24 of the enclosure 12 are installed to create turbulence in the convective flow of the working fluid. This increases the transfer of heat from the working fluid to the heat-exchanging surface(s). Baffles of several different designs are possible, the shape, size, and position of which will depend on the characteristics of the selected supercritical working fluid. For example, U.S. Pat. No. 6,799,587 describes a system of baffles designed for use in a supercritical fluid cleaning system that creates a relatively high velocity, cooled stream of supercritical fluid. The pressure buildup and burping action created by the baffles may be used to direct the high velocity, cooled fluid towards the hot chip(s) 18 and 20.

The substrate 10 is a material comprised of alternate layers of metal 40 that provide circuitry for power and ground distribution to the chips, and for the distribution of AC electrical signals to and from the chips. Between the metal layers 40 are insulating dielectric layers 42. This "substrate" which comprises the floor of the package must be strong enough to withstand the bending forces that are exerted by the supercritical working fluid, since the interior space 14 must be pressurized to the supercritical pressure of the working fluid (e.g., 545 psi in the case of sulfur hexafluoride). In the case of chips that are flip-chip attached to the substrate 10, the coefficient of thermal expansion of the substrate 10 must closely match that of the chip in order to reduce stress on the interconnection between the chip and the substrate 10 since underfill is not used. If, for example, the substrate is low-temperature or high-temperature cofired ceramic, the substrate may itself contribute to the removal of heat from the interior space 14 of the package.

The potential heat removal efficacy of a single-chip or multichip package using a supercritical working fluid as described above is 80 watts. Supercritical sulfur hexafluoride is used as the working fluid in which the temperature at the devices 18 and 20 is maintained at 75 C, the fluid flow past the chips is 5 cc/minute, and the temperature at the heat exchanger 26 is 50 C.

Heat removal can be increased by using other thermal management techniques in combination with the supercritical fluid. These include, for example, increasing the fluid flow by means of baffles 38 or active pumping of the fluid with pump 22, or by allowing the temperature at the chips to be higher. Also, thermal vias 25 may be formed through the substrate 10 at points beneath the heat producing device 20. These are metal throughholes that provide heat conductive paths through the substrate 10 at points where the temperature peaks. The higher heat conductivity of the vias 25 lowers the temperature at these points.

Other working fluids having even better heat transfer characteristics may also be used. Possible alternative working fluids include but are not limited to engineered heat transfer fluids such as fluorocarbons sold under the trademark "Fluorinerts" which are inert, have higher density and thermal conductivity than sulfur hexafluoride, and are designed to cover a wide range of temperatures.

Figure 3:
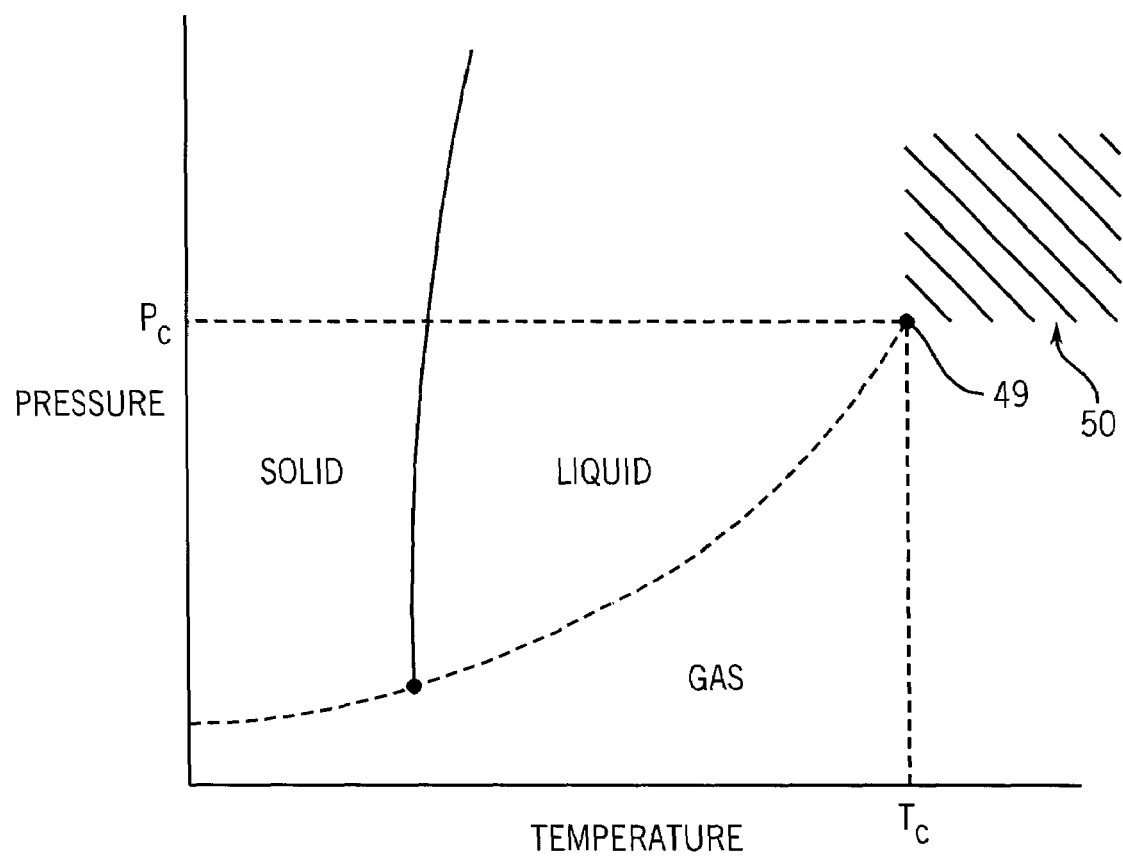
FIG. 3 is a graphic representation of the phases a typical working fluid used in the embodiment of FIG. 2 can have.

Referring to FIG. 3, supercritical fluids are fluids that have a critical point 49 defined as the set of physical conditions where the properties of the liquid phase and the gas phase of the fluid become identical. This condition is true for single component as well as multi-component working fluids. As indicated generally at cross-hatching 50 a supercritical fluid state exists in a pressure/temperature region that resides above a critical temperature $T_c$ and above a critical pressure $P_c$. To be useful in the present invention, a candidate fluid should have a critical temperature ($T_c$) that is lower than the maximum operating temperature allowable for the device being cooled and a critical pressure ($P_c$) that is practical to achieve in a commercial setting.

The invention claimed is:

1. A package for an electronic device which produces heat during its operation, which comprises:
    a substrate containing electrical conductors;
    means for mounting the electronic device to the substrate and electrically connecting the electronic device to the conductors therein;
    an enclosure disposed over the top surface of the substrate to form an enclosed space;
    means for cooling a wall of the enclosure; and
    a working fluid disposed in the enclosure;
    wherein the electronic device is operated to bring the working fluid above a critical temperature and critical pressure such that the working fluid is in a supercritical fluid state.

2. The package as recited in claim 1 in which the working fluid is electrically insulating and is in direct contact with the electronic device.

3. The package as recited in claim 2 in which the electronic device is an integrated circuit chip.

4. The package as recited in claim 3 in which the integrated circuit chip is mounted with an active surface having exposed wire bonds face up.

5. The package as recited in claim 3 in which the integrated circuit chip is mounted with an active surface face down.

6. The package as recited in claim 1 in which the working fluid is sulfur hexafluoride.

7. The package as recited in claim 1 in which the working fluid is a fluorocarbon.

8. The package as recited in claim 1 which includes baffles disposed in the enclosure to direct a convective flow of the working fluid therein.

9. The package as recited in claim 1 which includes a pump disposed in the enclosure to increase the flow of working fluid around the electronic device.

10. The package as recited in claim 9 in which a space is formed between the electronic device and the substrate and the pump is positioned to increase the flow of working fluid in this space.

11. The package as recited in claim 1 in which heat conductive vias are formed through the substrate and positioned beneath the electronic device.

* * * * *